(12) United States Patent
Kim et al.

(10) Patent No.: US 9,647,173 B2
(45) Date of Patent: May 9, 2017

(54) LIGHT EMITTING DEVICE (LED) HAVING AN ELECTRODE HOLE EXTENDING FROM A NONCONDUCTIVE SEMICONDUCTOR LAYER TO A SURFACE OF A CONDUCTIVE SEMICONDUCTOR LAYER

(75) Inventors: Sun Kyung Kim, Seoul (KR); Hyun Kyong Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 13/467,882

(22) Filed: May 9, 2012

(65) Prior Publication Data

US 2012/0217509 A1 Aug. 30, 2012

Related U.S. Application Data

(63) Continuation of application No. 12/674,356, filed as application No. PCT/KR2008/004997 on Aug. 26, 2008, now abandoned.

(30) Foreign Application Priority Data

Aug. 30, 2007 (KR) ........................ 10-2007-0087764

(51) Int. Cl.
*H01L 33/32* (2010.01)
*H01L 33/60* (2010.01)
(Continued)

(52) U.S. Cl.
CPC .............. *H01L 33/10* (2013.01); *H01L 33/20* (2013.01); *H01L 33/46* (2013.01); *H01L 2933/0083* (2013.01)

(58) Field of Classification Search
CPC .......... H01L 33/10; H01L 33/20; H01L 33/46
(Continued)

(56) References Cited

U.S. PATENT DOCUMENTS 5,779,924 A 7/1998 Krames et al.
6,495,862 B1 12/2002 Okazaki et al.
(Continued)

FOREIGN PATENT DOCUMENTS

CN 1812211 A 8/2006
CN 1874012 A 12/2006
(Continued)

OTHER PUBLICATIONS

Peng et al., "Enhanced performance of an InGaN—GaN light-emitting diode by roughening the undoped-GaN surface and applying a mirror coating to the sapphire substrate", Applied Physics Letters 88, 181117 (2006), pp. 6-8.
(Continued)

*Primary Examiner* — Anh Mai
(74) *Attorney, Agent, or Firm* — Birch, Stewart, Kolasch & Birch, LLP (57) ABSTRACT

A light-emitting device comprises a first conductive type semiconductor layer; a second conductive type semiconductor layer under the first conductive type semiconductor layer; an active layer between the first conductive type semiconductor layer and the second conductive type semiconductor layer; a nonconductive semiconductor layer on the first conductive type semiconductor layer and including a light extraction structure formed in the nonconductive semiconductor layer; a recess disposed from the nonconductive semiconductor layer to an upper portion of the first conductive type semiconductor layer; a first electrode layer on the upper portion of the first conductive type semiconductor layer; a second electrode layer under the second conductive type semiconductor layer.

12 Claims, 7 Drawing Sheets

(51) Int. Cl.
*H01L 33/10* (2010.01)
*H01L 33/20* (2010.01)
*H01L 33/46* (2010.01)

(58) Field of Classification Search
USPC .................................................... 257/98
See application file for complete search history.

(56) References Cited

U.S. PATENT DOCUMENTS

| | | | |
|---|---|---|---|
| 7,138,666 B2 | 11/2006 | Erchak et al. | |
| 7,173,289 B1 | 2/2007 | Wu et al. | |
| 7,250,635 B2 | 7/2007 | Lee et al. | |
| 7,714,337 B2 | 5/2010 | Kim et al. | |
| 7,755,097 B2 | 7/2010 | Kim | |
| 7,893,451 B2 | 2/2011 | Cho et al. | |
| 7,929,881 B2 | 4/2011 | Yoshino et al. | |
| 8,729,580 B2* | 5/2014 | Lester | 257/98 |
| 2004/0072383 A1 | 4/2004 | Nagahama et al. | |
| 2004/0207310 A1 | 10/2004 | Erchak et al. | |
| 2005/0104081 A1 | 5/2005 | Kim et al. | |
| 2005/0199891 A1 | 9/2005 | Kunisato et al. | |
| 2006/0054919 A1 | 3/2006 | Matsuda et al. | |
| 2006/0163599 A1 | 7/2006 | Tsai et al. | |
| 2006/0204865 A1 | 9/2006 | Erchak et al. | |
| 2006/0237734 A1 | 10/2006 | Baur et al. | |
| 2006/0273324 A1 | 12/2006 | Asai et al. | |
| 2007/0023763 A1 | 2/2007 | Takigawa et al. | |
| 2007/0257269 A1* | 11/2007 | Cho et al. | 257/95 |
| 2007/0267644 A1 | 11/2007 | Leem | |
| 2010/0127295 A1 | 5/2010 | Kim et al. | |
| 2010/0140643 A1 | 6/2010 | Cho et al. | |
| 2010/0163895 A1* | 7/2010 | Horie | 257/98 |
| 2010/0181586 A1 | 7/2010 | Kim | |
| 2010/0207141 A1 | 8/2010 | Cho | |
| 2010/0219434 A1 | 9/2010 | Kim | |
| 2010/0230685 A1 | 9/2010 | Cho et al. | |
| 2010/0308363 A1 | 12/2010 | Kim | |
| 2011/0095332 A1 | 4/2011 | Hwang et al. | |

FOREIGN PATENT DOCUMENTS

| | | |
|---|---|---|
| JP | 11-68157 A | 3/1999 |
| JP | 2002-280609 A | 9/2002 |
| JP | 2004-266240 A | 9/2004 |
| JP | 2005-150675 A | 6/2005 |
| JP | 2005-259832 A | 9/2005 |
| JP | 2005-302804 A | 10/2005 |
| JP | 2006-49855 A | 2/2006 |
| JP | 2006-93686 A | 4/2006 |
| JP | 2006-278751 A | 10/2006 |
| JP | 2006-523957 A | 10/2006 |
| JP | 2007-35967 A | 2/2007 |
| JP | 2007-207981 A | 8/2007 |
| KR | 10-2006-0131327 A | 12/2006 |
| KR | 10-2006-0135599 A | 12/2006 |
| KR | 10-2007-0008745 A | 1/2007 |

OTHER PUBLICATIONS

David et al., "Optimization of Light-Deffracting Photonic-Crystals for High Extraction Efficiency LEDs," Journal of Display Technology, vol. 3, No. 2, Jun. 2007, pp. 133-148.

* cited by examiner

000
LIGHT EMITTING DEVICE (LED) HAVING AN ELECTRODE HOLE EXTENDING FROM A NONCONDUCTIVE SEMICONDUCTOR LAYER TO A SURFACE OF A CONDUCTIVE SEMICONDUCTOR LAYER

CROSS-REFERENCE TO RELATED APPLICATIONS

This application is a Continuation of application Ser. No. 12/674,356 filed on Feb. 19, 2010, now abandoned which is the national phase of PCT International Application No. PCT/KR2008/004997 filed on Aug. 26, 2008, and which claims priority to Application No. 10-2007-0087764 filed in the Republic of Korea, on Aug. 30, 2007. The entire contents of all of the above applications are hereby incorporated by reference.

DESCRIPTION

Technical Field

The present disclosure relates to a light-emitting device and a method for fabricating the same.

Background Art

A light-emitting diode (LED) is a semiconductor light-emitting device that converts an electrical current to light.

The wavelength of light emitted from the LED is determined depending on a semiconductor material used to fabricate the LED. This is because the wavelength of the emitted light corresponds to a band gap of the semiconductor material, which is defined as an energy difference between electrons in the valence band and electrons in the conduction band.

Recently, the brightness of the LED gradually increases, and the LED is being used as a light source for a display, a light source for a vehicle, a light source for illumination. Also, it is possible to realize an LED with high efficiency emitting white light, by using a fluorescent material or combining a variety of color LEDs.

Meanwhile, the brightness of the LED depends on various conditions such as a structure of an active layer, a light extraction structure that can effectively extract light to the outside, a chip size, and a kind of a molding member surrounding the LED.

DISCLOSURE

Technical Problem

Embodiments provide a light-emitting device having a new structure, and a method for fabricating the same.

Embodiments also provide a light-emitting device with enhanced light extraction efficiency, and a method for fabricating the same.

Technical Solution

In an embodiment, a light-emitting device comprises: a second conductive type semiconductor layer; an active layer on the second conductive type semiconductor layer; a first conductive type semiconductor layer on the active layer; and a nonconductive semiconductor layer on the first conductive type semiconductor layer, the nonconductive semiconductor layer comprising a light extraction structure.

In an embodiment, a light-emitting device comprises: a second conductive type semiconductor layer; an active layer on the second conductive type semiconductor layer; a first conductive type semiconductor layer on the active layer; a nonconductive layer on the first conductive type semiconductor layer; and a light extraction layer comprising a light extraction structure on the nonconductive layer.

In an embodiment, a method for fabricating a light-emitting device comprises: forming a nonconductive semiconductor layer on a substrate; forming a first conductive type semiconductor layer, an active layer, and a second conductive type semiconductor layer on the nonconductive semiconductor layer; forming a second electrode layer on the second conductive type semiconductor layer; removing the substrate; and forming a light extraction structure on the nonconductive semiconductor layer.

Advantageous Effects

Embodiments can provide a light-emitting device having a new structure, and a method for fabricating the same.

Also, embodiments can provide a light-emitting device with enhanced light extraction efficiency, and a method for fabricating the same.

MODE FOR INVENTION

Reference will now be made in detail to the embodiments of the present disclosure, examples of which are illustrated in the accompanying drawings.

It will be apparent to those skilled in the art that various modifications and variations can be made in the present invention without departing form the spirit or scope of the invention. Thus, it is intended that the present invention covers the modifications and variations of this invention provided they come within the scope of the appended claims and their equivalents.

Like reference numerals designate like elements throughout the drawings. In the drawings, the thicknesses of layers, films, regions, etc., are exaggerated for clarity.

In the following description, it will be understood that when a layer (or film) is referred to as being 'on' or 'under' another layer or substrate, it can be directly on or under the other layer or substrate, or intervening layers may also be present. Further, it will be understood that when a constituent element such as 'surface' is referred to as 'inner', this means that the surface is farther from an outer side of the device than other constituent elements.

It will be further understood that orientations of constituent elements in the drawings are not limited thereto. In addition, when the word 'directly' is referred, it means that no intervening constituent element is present. The word 'and/or' means that one or more or a combination of relevant constituent elements is possible.

Figure 1:
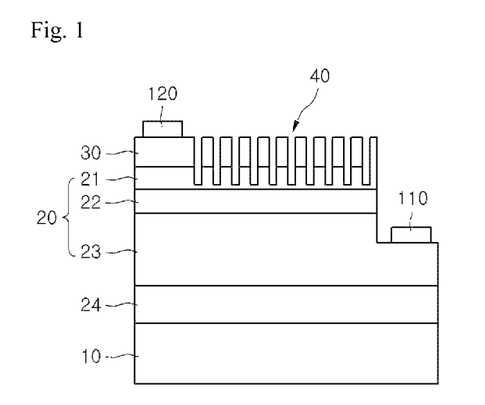
FIG. 1 is a view illustrating a lateral type light-emitting device according to a first embodiment.
Figure 2:
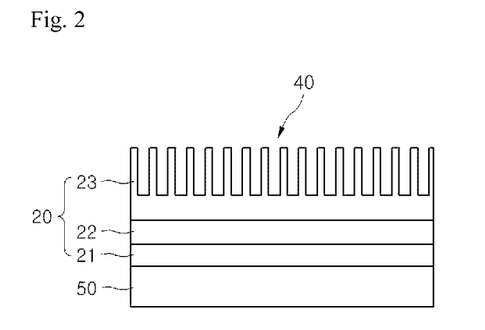
FIG. 2 is a view illustrating a vertical type light-emitting device according to a second embodiment.

FIG. 1 is a view illustrating a lateral type light-emitting device according to a first embodiment. FIG. 2 is a view illustrating a vertical type light-emitting device according to a second embodiment.

Referring to FIG. 1, the lateral type light-emitting device includes a substrate 10, an undoped gallium nitride (GaN) layer 24 on the substrate 10, a light-emitting semiconductor layer 20 on the undoped GaN layer 24, and an ohmic contact layer 30 on the light-emitting semiconductor layer 20.

The light-emitting semiconductor layer 20 includes a first conductive type semiconductor layer 23, an active layer 22, and a second conductive type semiconductor layer 21. The light-emitting semiconductor layer 20 may be formed of GaN-based materials.

Here, if the first conductive type semiconductor layer 23 is an n-type semiconductor layer, the second conductive type semiconductor layer 21 may be a p-type semiconductor layer. Alternatively, if the first conductive type semiconductor layer 23 is a p-type semiconductor layer, the second conductive type semiconductor layer 21 may be an n-type semiconductor layer.

In addition, a first electrode layer 110 may be formed on the first conductive type semiconductor layer 23, and a second electrode layer 120 may be formed on the ohmic contact layer 30.

A GaN-based material layer including the undoped GaN layer 24 and the light-emitting semiconductor layer 20 grows on the substrate 10. For example, the substrate 10 may employ a sapphire substrate of which a refractive index is lower than that of the GaN-based material layer. Since the GaN-based material layer has a thickness of about 5 μm, it may be regarded as a waveguide structure having a variety of higher modes.

In the lateral type light-emitting device, to uniformly supply a current to an entire region of the active layer 22 and reduce the resistance between the second electrode layer 120 and the second conductive type semiconductor layer 21, the ohmic contact layer 30 is formed on the second conductive type semiconductor layer 21. For example, the ohmic contact layer 30 may include a transparent electrode formed of indium tin oxide (ITO) or the like.

Meanwhile, when a photonic crystal 40 is introduced to the lateral type light-emitting device by forming a hole structure or a pillar structure, the maximum etchable depth equals to the sum of thicknesses of both the ohmic contact layer 30 and the second conductive type semiconductor layer 21.

The sum of the thicknesses of the ohmic contact layer 30 and the second conductive type semiconductor layer 21 is in a range of 100 nm to 300 nm. Accordingly, the etchable depth is limited to the range of 100 nm to 300 nm so that it is difficult to form the photonic crystal 40 with good light extraction efficiency.

Referring to FIG. 2, the vertical type light-emitting device includes a second electrode layer 50, and a light-emitting semiconductor layer 20 on the second electrode layer 50.

The light-emitting semiconductor layer 20 includes a first conductive type semiconductor layer 23, an active layer 22, and a second conductive type semiconductor layer 21. Although not shown, a first electrode layer may be formed on the first conductive type semiconductor layer 23 so as to supply a power to the active layer 22 together with the second electrode layer 50.

In the vertical type light-emitting device, a GaN-based material layer is formed on the substrate, and thereafter the substrate is removed through a laser absorption method. The second electrode layer 50 provided with multi-layered thin films is formed under the second conductive type semiconductor layer 21. Herein, the second electrode layer 50 may act as a reflection layer and an electrode at the same time.

For example, the second electrode layer 50 may have a multilayered structure configured with an ohmic contact layer, a reflection layer and a conductive substrate, or may include a metal such as nickel (Ni) and silver (Ag).

In the vertical type light-emitting device, the second electrode layer 50 is formed by removing the substrate, which differs from the lateral type light-emitting device.

Therefore, since a current flows vertically in the vertical type light-emitting device, there is a great likelihood that the current reaches the active layer 22, and further it is advantageous in that heat is easily released through the second electrode layer 50.

Furthermore, the vertical type light-emitting device has such an advantageous merit that the photonic crystal 40 allowing light extraction efficiency to be increased can be easily introduced because the first conductive type semiconductor layer 23 is disposed on the active layer 22.

That is, the n-type GaN layer formed on the active layer 22 is formed thicker than the p-type GaN layer, and thus the maximum etchable depth is great when introducing the photonic crystal 40.

Since the light extraction efficiency is mostly proportional to an etch depth in the photonic crystal until it is saturated, the fact the maximum etchable depth is great provides an advantage that it is less restrictive to form the photonic crystal 40.

Furthermore, the vertical type light-emitting device has such a characteristic that a distance between the active layer 22 and the second electrode layer 50 is shorter than the wavelength of light emitted from the active layer 22. In other words, the vertical type light-emitting device has a characteristic that the thickness of the second conductive type semiconductor layer 21 is shorter than the wavelength of light.

Since the active layer 22 is disposed in the vicinity of the second electrode layer 50, it is possible to control a radiation pattern using the reflective behavior of the second electrode layer 50, and to improve the light extraction efficiency as well.

Meanwhile, the light extraction efficiency is closely related to diffraction efficiency. For example, the diffraction efficiency may be changed due to a lattice constant of a unit pattern in the photonic crystal 40 having a hole or pillar structure, e.g., structural factors such as a size (diameter) of the unit pattern, a depth or height of the unit pattern, and an arrangement of the unit patterns in a plane.

FIGS. 3 to 7 are views illustrating the arrangement of unit patterns having a hole structure or a pillar structure in a plane.

Figure 3:
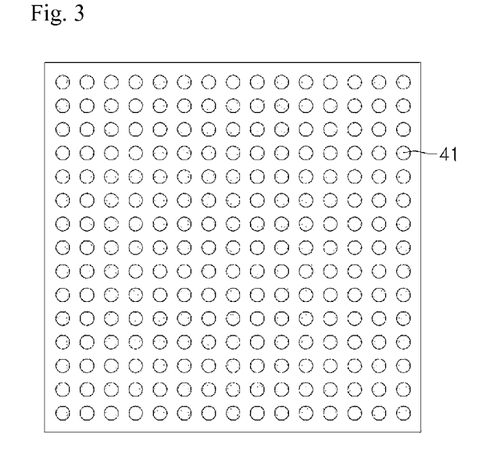
FIGS. 3 to 7 are views illustrating the arrangement of unit patterns having a hole structure or a pillar structure in a plane.
Figure 4:
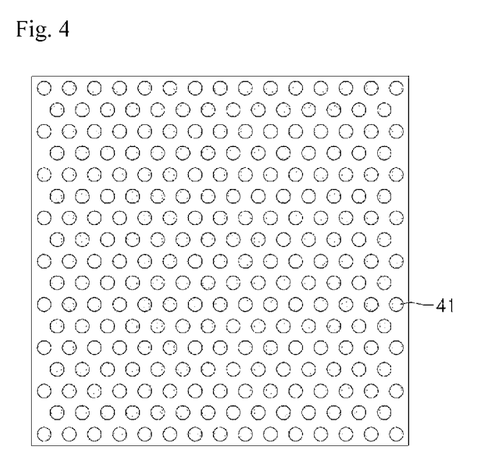
Figure 5:
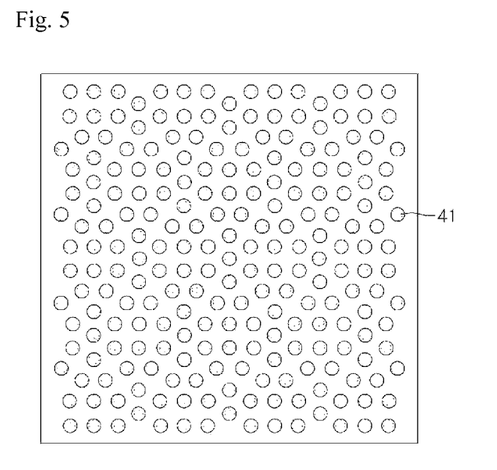
Figure 6:
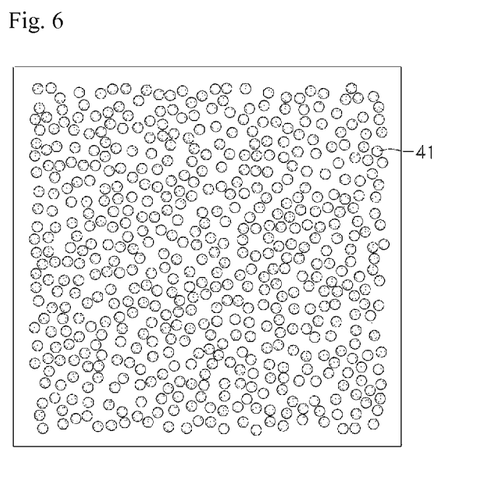
Figure 7:
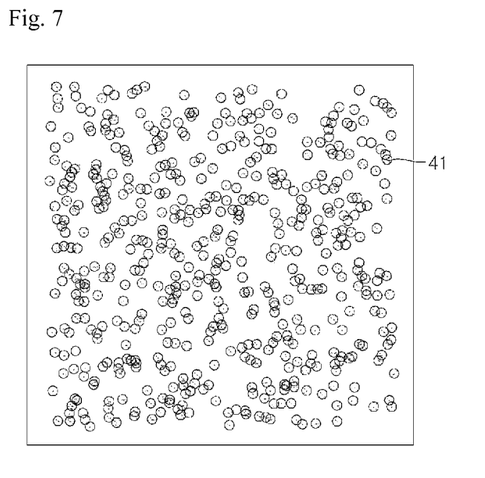

FIG. 3 illustrates that a plurality of unit patterns 41 are arranged in the shape of a rectangular lattice. FIG. 4 illustrates that a plurality of unit patterns 41 are arranged in the shape of a triangle lattice. FIG. 5 illustrates that a plurality of unit patterns 41 are arranged in the shape of an Archimedean lattice. FIG. 6 illustrates that a plurality of unit patterns 41 are arranged pseudo-randomly where an average distance between the plurality of unit patterns 41 is constant. FIG. 7 illustrates that a plurality of unit patterns 41 are randomly arranged.

The arrangement of the unit patterns 41 in a plane as shown in FIGS. 3 to 7 affects the diffraction efficiency, leading to a change in light extraction efficiency.

Figure 8:
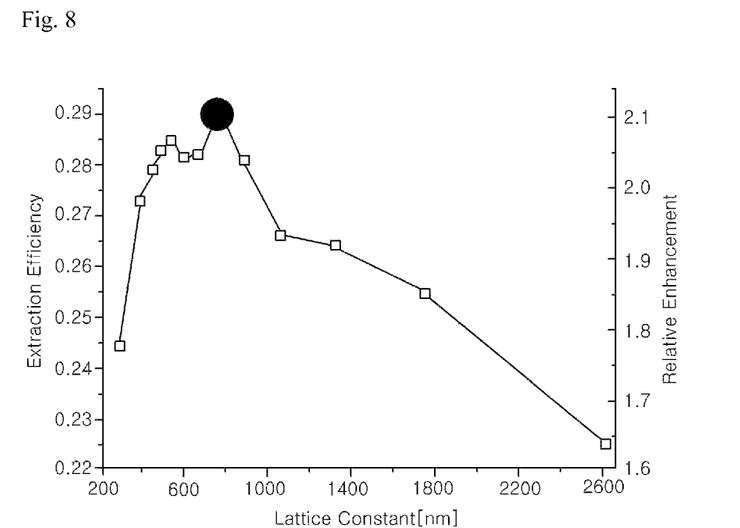
FIGS. 8 to 10 are graphs showing simulation results of light extraction efficiency while varying structural factors of the vertical type light-emitting device shown in FIG. 2.
Figure 9:
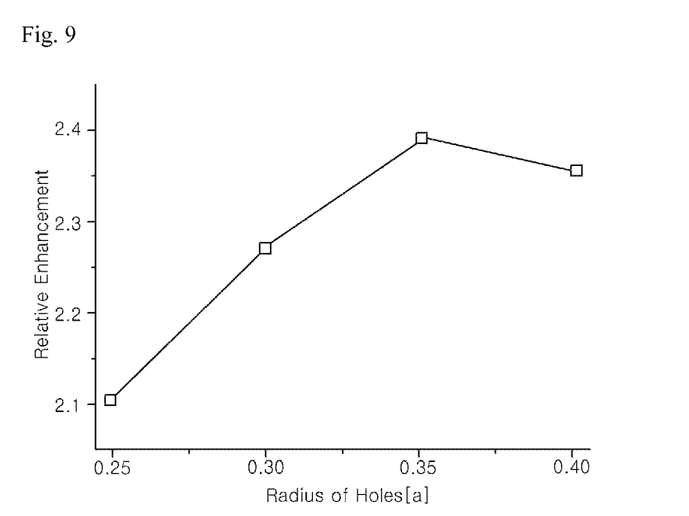
Figure 10:
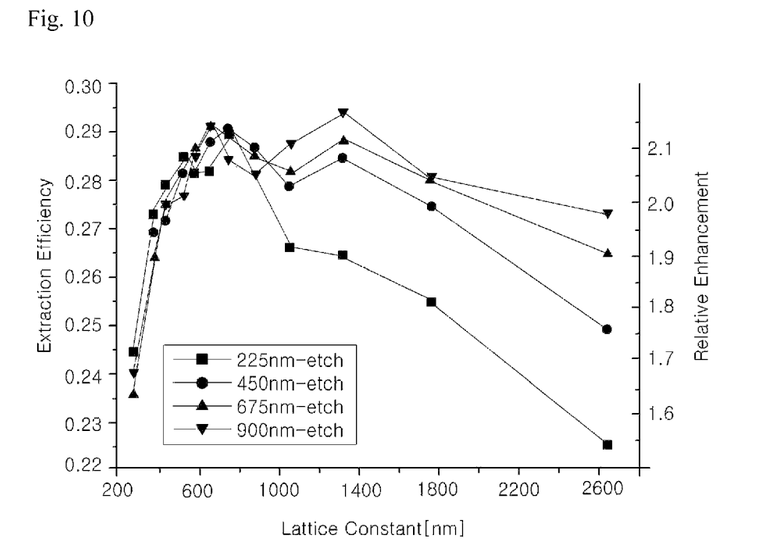

FIGS. 8 to 10 are graphs showing simulation results of light extraction efficiency while varying structural factors of the vertical type light-emitting device as illustrated in FIG. 2.

Referring to FIG. 8, when a distance between the unit patterns 41, i.e., a lattice constant is changed under the condition that a hole of which a radius is 250 nm and a depth is 225 nm is used as the unit pattern 41, it can be observed that the maximum light extraction efficiency can be achieved at around 800 nm. At this time, the relative enhancement of the light extraction efficiency is up to about 2 times.

Referring to FIG. 9, when a hole radius is changed under the condition that a hole of which an etch depth is 225 nm and a lattice constant (a) is 800 nm is used as the unit pattern 41, it can be observed that the light extraction efficiency is excellent if the hole radius ranges from 0.325a to 0.40a, and the maximum light extraction efficiency can be achieved at around 0.35a. At this time, the relative enhancement of the light extraction efficiency is up to about 2.4 times.

Referring to FIG. 10, when an etch depth and a lattice constant (a) are changed under the condition that a hole having a radius of 0.25a is used as the unit pattern, it can be observed that the light extraction efficiency is excellent regardless of the etch depth at 600 nm, however, the light extraction efficiency is excellent at 1400 nm when the etch depth is in the range of 450 nm to 900 nm.

Since the etch depth is limited to a range of 100 nm to 300 nm in the lateral type light-emitting device of FIG. 1, the light extraction efficiency may be decreased when a lattice constant is 1,000 nm or more. However, the etch depth of a hole can be increased to 450 nm or more in the vertical type light-emitting device of FIG. 2, and thus the light extraction efficiency is not greatly decreased although the lattice constant (a) is changed.

Similar results to the aforesaid simulation results can also be achieved in other vertical type light-emitting devices having various structures.

FIGS. 11 to 14 are views illustrating a light-emitting device and a method for fabricating the same according to a third embodiment.

Figure 11:
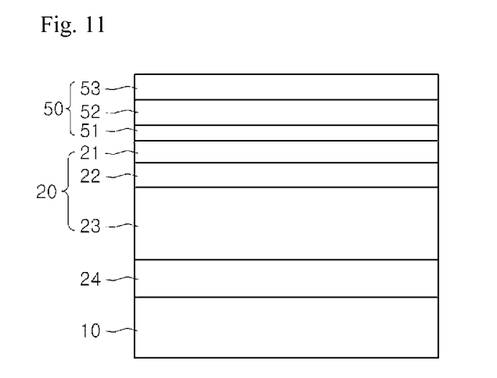
FIGS. 11 to 14 are views illustrating a light-emitting device and a method for fabricating the same according to a third embodiment.

Referring to FIG. 11, a nonconductive semiconductor layer 24, a light-emitting semiconductor layer 20, and a second electrode layer 50 are formed on a substrate 10.

The light-emitting semiconductor layer 20 includes a first conductive type semiconductor layer 23, an active layer 22, and a second conductive type semiconductor layer 21.

The second electrode layer 50 includes an ohmic contact layer 51, a reflection layer 52 and a conductive substrate 53. For example, the conductive substrate 53 may be formed of at least one of titanium (Ti), chromium (Cr), nickel (Ni), aluminum (Al), platinum (Pt), gold (Au) and tungsten (W). The reflection layer 52 may be formed of a metal including at least one of Ag, aluminum (Al), copper (Cu) and Ni. The ohmic contact layer 51 may include a transparent electrode layer. For instance, the ohmic contact layer 51 may be formed of at least one of ITO, ZnO, $RuO_x$, $TiO_x$ and $IrO_x$.

The nonconductive semiconductor layer 24 means a semiconductor layer formed of a material having an electrical conductivity lower than the first and second conductive type semiconductor layers 23 and 21. For example, the nonconductive semiconductor layer 24 may be an undoped GaN layer.

Figure 12:
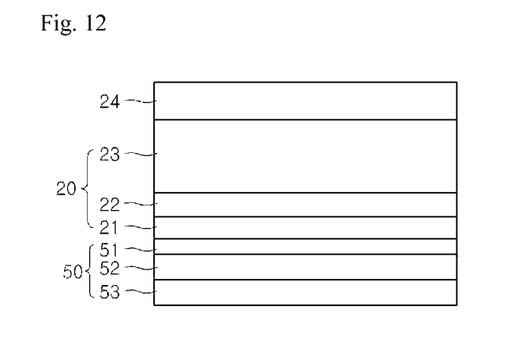

Referring to FIG. 12, the substrate 10 is removed from the nonconductive semiconductor layer 24. For instance, the substrate 10 may be removed through a laser absorption method.

Figure 13:
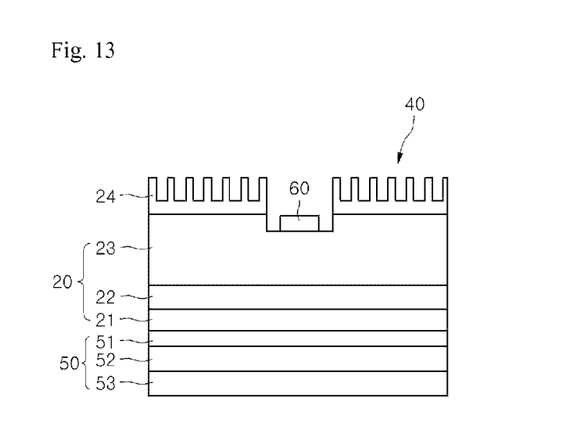

Referring to FIG. 13, the nonconductive semiconductor layer 24 and the first conductive type semiconductor layer 23 are selectively removed, thereby exposing a portion of the first conductive type semiconductor layer 23 in an upper direction. Thereafter, a first electrode layer 60 is formed on the exposed portion of the first conductive type semiconductor layer 23.

A photonic crystal 40 is formed on the top surface of the nonconductive semiconductor layer 24. Here, the photonic crystal 40 is a light extraction structure including variously shaped patterns that can increase the light extraction efficiency.

The photonic crystal 40 is formed by selectively etching the top surface of the nonconductive semiconductor layer 24 in a hole or pillar form.

When the hole or pillar is formed, the light extraction efficiency can be further increased if the nonconductive semiconductor layer 24 is etched to a depth of $\lambda/n$ or more. Here, n represents the refractive index of the nonconductive semiconductor layer 24, and $\lambda$ represents the wavelength of light emitted from the active layer 22. The etch depth, i.e., $\lambda/n$ or more, is also applicable to other embodiments.

In the third embodiment, the photonic crystal 40 is formed on the nonconductive semiconductor layer 24 while the nonconductive semiconductor layer 24 disposed between the first conductive type semiconductor layer 23 and the substrate 10 is not removed.

The nonconductive semiconductor layer 24 has a thickness of 500 nm to 2,000 nm so that it is possible to form unit patterns having various etch depths.

Figure 14:
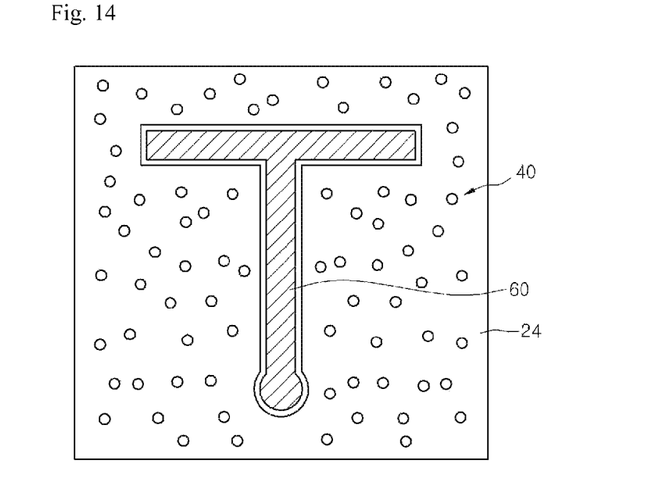

FIG. 14 is a plan view of the light-emitting device of FIG. 13, illustrating the shape and arrangement of the photonic crystal 40 and the first electrode layer 60.

Although not shown, when the nonconductive semiconductor layer 24 is formed thinly, it is also possible to form the photonic crystal 40 by selectively etching the nonconductive semiconductor layer 24 and the first conductive type semiconductor layer 23.

Figure 15:
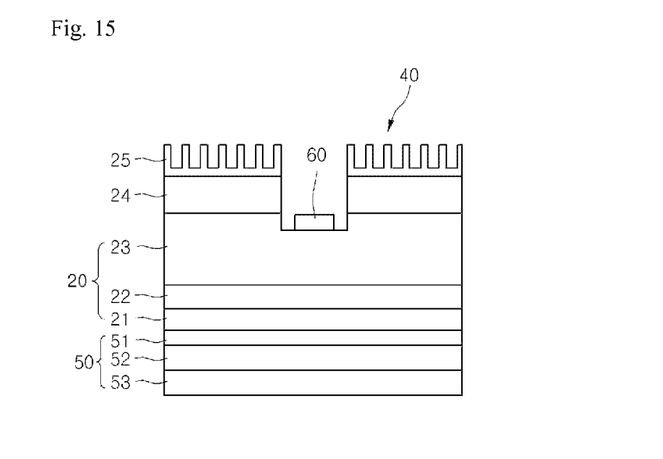
FIGS. 15 and 16 are views illustrating a light-emitting device and a method for fabricating the same according to a fourth embodiment.
Figure 16:
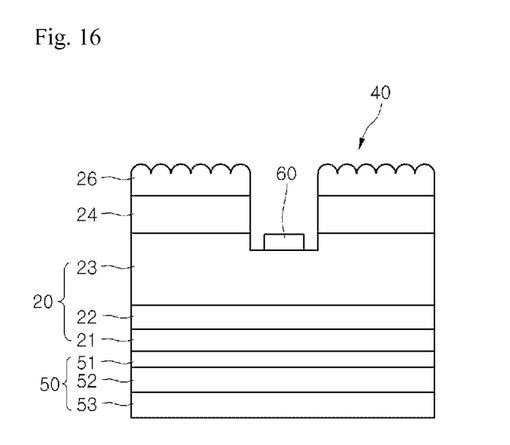

FIGS. 15 and 16 are sectional views illustrating a light-emitting device and a method for fabricating the same according to a fourth embodiment. In the fourth embodiment, duplicate description that has been made in the third embodiment will be omitted.

In the light-emitting device according to the fourth embodiment of FIGS. 15 and 16, a substrate 10 is removed, and light extraction layers 25 and 26 are then formed on the nonconductive semiconductor layer, as illustrated in FIG. 12.

The light extraction layers 25 and 26, the nonconductive semiconductor layer 24, and the first conductive type semiconductor layer 23 are selectively removed to thereby form a first electrode 60.

Further, the top surfaces of the light extraction layers 25 and 26 are selectively etched to form a photonic crystal 40.

The light extraction layers 25 and 26 may be formed of a material of which a refractive index is equal to or greater than that of the nonconductive semiconductor layer 24. For example, the light extraction layers 25 and 26 may be formed of $TiO_2$ or $Si_3N_4$.

When the refractive indices of the light extraction layers 25 and 26 are higher than that of the nonconductive semiconductor layer 24, the light extraction efficiency may be further improved. Since the light extraction layers 25 and 26 are formed on the nonconductive semiconductor layer 24, they do not affect electrical properties of the light-emitting device.

FIG. 15 illustrates that the photonic crystal 40 is formed in the shape of a hole, and FIG. 16 illustrates that the photonic crystal 40 is formed in the shape of a hemisphere.

Although not shown, when the light extraction layers 25 and 26 are formed thinly, the photonic crystal 40 may be formed by selectively etching the light extraction layers 25 and 26 and the nonconductive semiconductor layer 24.

Figure 17:
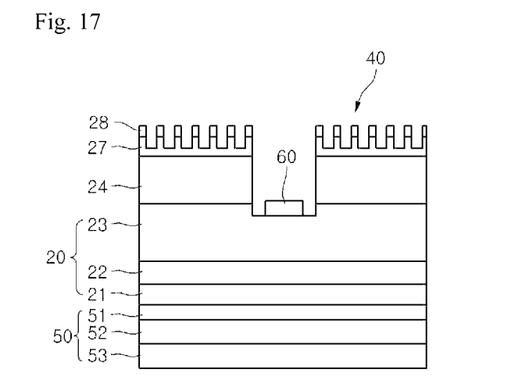
FIGS. 17 and 18 are views illustrating a light-emitting device and a method for fabricating the same according to a fifth embodiment.
Figure 18:
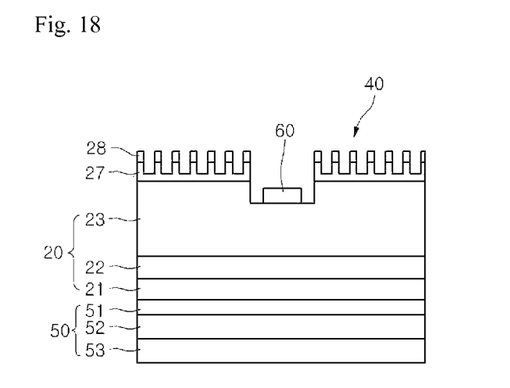

FIGS. 17 and 18 are sectional views illustrating a light-emitting device and a method for fabricating the same according to a fifth embodiment. In the fifth embodiment, duplicate description that has been made in the fourth embodiment will be omitted.

In the light-emitting device according to the fifth embodiment of FIG. 17, a substrate 10 is removed, and first and second light extraction layers 27 and 28 are then formed on the nonconductive semiconductor layer, as illustrated in FIG. 12.

The first light extraction layer 27, the second light extraction layer 28, the nonconductive semiconductor layer 24, and the first conductive type semiconductor layer 23 are selectively removed to thereby form a first electrode 60. A top surface of the first electrode layer 60 is higher than a bottom surface of the nonconductive semiconductor layer 24 and below the top surface of the nonconductive semiconductor layer 24. Further, the first and second light extraction layers 27 and 28 are selectively etched to form a photonic crystal 40.

In the light-emitting device of FIG. 18, the first and second light extraction layers 27 and 28 are then formed on the first conductive type semiconductor layer 23 after the substrate 10 and the nonconductive semiconductor layer 24 are removed.

The second light extraction layer 28, the first light extraction layer 27 and the first conductive type semiconductor layer 23 are selectively removed to thereby form the first electrode 60. In addition, the first and second light extraction layers 27 and 28 are selectively etched to form the photonic crystal 40.

The first and second light extraction layers 27 and 28 shown in FIGS. 17 and 18 may be nonconductive. The first light extraction layer 27 has a first refractive index, and the second light extraction layer 28 has a second refractive index lower than the first refractive index.

The first refractive index of the first light extraction layer 27 is equal to or greater than those of the first conductive type semiconductor layer 23 and the nonconductive semiconductor layer 24.

For example, the first light extraction layer 27 may be formed of $TiO_2$ or $Si_3N_4$, and the second light extraction layer may be formed of $SiO_2$.

Although it is disclosed in the embodiment of FIGS. 17 and 18 that the photonic crystal 40 is formed by etching two kinds of light extraction layers having different refractive indices, the photonic crystal 40 may be formed by etching three or more kinds of light extraction layers simultaneously.

In the fifth embodiment, the first light extraction layer 27 with the first refractive index and the second light extraction layer 28 with the second refractive index are formed on the first conductive type semiconductor layer 23, which can further improve the light extraction efficiency.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The light-emitting device according to the previous embodiments can be used as a light source of various electronic devices as well as lighting apparatuses.

What is claimed is:

1. A light-emitting device comprising:
a first conductive type semiconductor layer including an n-type dopant;
a second conductive type semiconductor layer including a p-type dopant under the first conductive type semiconductor layer;
an active layer between the first conductive type semiconductor layer and the second conductive type semiconductor layer;
a nonconductive layer on a top surface of the first conductive type semiconductor layer;
a plurality of light extraction layers on a top surface of the nonconductive layer;
a recess recessed from the plurality of light extraction layers to an upper surface of the first conductive type semiconductor layer;
a first electrode layer on the upper surface of the first conductive type semiconductor layer and disposed in the recess; and
a second electrode layer under the second conductive type semiconductor layer,
wherein the plurality of light extraction layers are formed of a different material from the nonconductive layer,
wherein at least one of the plurality light extraction layers includes at least one of $TiO_2$, $Si_3N_4$ or $SiO_2$,
wherein the nonconductive layer is disposed between the plurality of light extraction layers and the first conductive type semiconductor layer,
wherein the light extraction layers include a plurality of first holes,
wherein the plurality of first holes has the depth smaller than a depth of the recess,
wherein the light extraction layers have a first light extraction layer contacting the nonconductive layer, and a second light extraction layer on the first extraction layer,
wherein the first light extraction layer has a different material from the second light extraction layer,
wherein a bottom surface of the second extraction layer is located at a higher position than a top surface of the first extraction layer and directly contacts the top surface of the first extraction layer,
wherein the first extraction layer is formed of a material having a first refractive index greater than a third refractive index of the nonconductive layer and a second refractive index of the second extraction layer,
wherein the second electrode layer comprises a contact layer under the second conductive type semiconductor layer, a reflection layer under the contact layer, and a conductive support layer under the reflection layer, wherein the nonconductive layer is formed of a semiconductor, wherein a radius of each of the first holes of a unit pattern constituting the light extraction layer ranges from 0.325a to 0.40a, in which a is about 800 nm, wherein the recess includes a cavity shape having a depth deeper than the top surface of the nonconductive layer, wherein a bottom surface of the first electrode layer directly contacts the upper surface of the first conductive type semiconductor layer wherein a lateral surface of the first electrode layer is spaced from a lateral surface of the first recess by a gap which is an opened space between the first electrode layer and the nonconductive layer, wherein a top surface of the first electrode layer is higher than a bottom surface of the nonconductive layer and below the top surface of the nonconductive layer.

2. The light-emitting device according to claim 1, wherein the conductive support layer has a width equal or less than that of the reflection layer and is physically contacted with the reflection layer.

3. The light emitting device according to claim 1, wherein the first light extraction layer is formed of $TiO_2$ or $Si_3N_4$.

4. The light emitting device according to claim 1, wherein a top surface of the first extraction layer is exposed and both a top surface and a side surface of the second extraction layer are exposed.

5. A light-emitting device comprising:
a first conductive type semiconductor layer including an n-type dopant;
a second conductive type semiconductor layer including a p-type dopant under the first conductive type semiconductor layer;
an active layer between the first conductive type semiconductor layer and the second conductive type semiconductor layer;
a nonconductive layer on the first conductive type semiconductor layer;
a first recess recessed from the nonconductive layer to the first conductive type semiconductor layer;
a first electrode layer on an upper surface of the first conductive type semiconductor layer and disposed in the first recess;
a second electrode layer under the second conductive type semiconductor layer;
a conductive support layer under the second electrode layer; and
a reflection layer between the conductive support layer and the second electrode layer; and
a light extraction layer disposed on a top surface of the nonconductive layer, wherein the nonconductive layer is disposed between the light extraction layer and the first conductive type semiconductor layer, wherein the light extraction layer includes a first layer contacting the top surface of the nonconductive layer and a second layer on a top surface of the first layer, wherein the first layer is disposed between the second layer and the nonconductive layer, wherein the first layer has a first refractive index and the second layer has a second refractive index different from the first refractive index, wherein the first layer and the second layer includes a different material from the nonconductive layer, wherein the light extraction layer has a plurality of second recesses recessed from the second layer to a portion of the first layer, wherein the first layer is directly contacted between the nonconductive layer and the second layer, wherein the first layer is formed of a material having the first refractive index greater than a third refractive index of the first semiconductor layer and greater than the second refractive index of the second layer, wherein side surfaces of the plurality of second recesses are formed in a vertical surface with respect to a bottom surface of the first layer, wherein each of the first and second layers is formed of an insulating material, wherein the first layer includes a bottom part between the plurality of recesses and the nonconductive layer and a protrusion part around the plurality of recesses, and wherein the protrusion part of the first layer directly contacts the bottom surface of the second layer, wherein the nonconductive layer is formed of a semiconductor, wherein each of the plurality of second recesses has a shape of a hole, wherein a radius of the hole of a unit pattern constituting the light extraction layer ranges from 0.325a to 0.40a, in which a is about 800 nm, wherein the second recesses of the light extraction layer has a depth of a range from 450 nm to 900 nm, wherein the first recess includes a cavity shape having a depth deeper than the top surface of the nonconductive layer, wherein a bottom surface of the first electrode layer directly contacts the upper surface of the first conductive type semiconductor layer, wherein a lateral surface of the first electrode layer is spaced from a lateral surface of the first recess by a gap which is an opened space between the first electrode layer and the nonconductive layer, and wherein a top surface of the first electrode layer is higher than a bottom surface of the nonconductive layer and below the top surface of the nonconductive layer.

6. The light-emitting device according to claim 5, wherein the nonconductive layer is an undoped layer and is overlapped in a vertical direction with the protrusion part of the first layer.

7. The light-emitting device according to claim 5, wherein the first layer of the light extraction layer is formed of $TiO_2$ or $Si_3N_4$.

8. The light-emitting device according to claim 7, wherein the second layer comprises a material of $SiO_2$.

9. The light emitting device according to claim 5, wherein the nonconductive layer is formed of an undoped layer and the first layer is formed of a $TiO_2$ layer directly contacted with the undoped layer.

10. The light emitting device according to claim 5, wherein the first electrode layer includes a first line electrode parallel to a first lateral surface of the nonconductive layer and a second line electrode parallel to a second lateral surface of the nonconductive layer, wherein the first lateral surface is adjacent to the second lateral surface of a lateral surface of the nonconductive layer, and wherein the first line electrode is connected to the second line electrode.

11. The light emitting device according to claim 10, wherein the first and the second line electrodes are spaced from the lateral surface of the first recess by the gap.

12. The light emitting device according to claim 5, wherein the first layer has a first refractive index, the second layer has a second refractive index lower than the first refractive index, and
   a top surface of the first layer is exposed and both a top surface and a side surface of the second layer are exposed.

\* \* \* \* \*